(12) United States Patent
Kurd et al.

(10) Patent No.: US 8,878,579 B2
(45) Date of Patent: Nov. 4, 2014

(54) SYSTEM AND METHOD FOR SCALING POWER OF A PHASE-LOCKED LOOP ARCHITECTURE

(75) Inventors: Nasser A. Kurd, Portland, OR (US); Vaughn J. Grossnickle, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/995,903

(22) PCT Filed: Dec. 20, 2011

(86) PCT No.: PCT/US2011/066205
§ 371 (c)(1),
(2), (4) Date: Jun. 19, 2013

(87) PCT Pub. No.: WO2013/095390
PCT Pub. Date: Jun. 27, 2013

(65) Prior Publication Data
US 2014/0103973 A1 Apr. 17, 2014

(51) Int. Cl.
*H03L 7/06* (2006.01)
*G06F 1/32* (2006.01)
*G06F 1/08* (2006.01)
*H03L 7/08* (2006.01)

(52) U.S. Cl.
CPC .............. *H03L 7/08* (2013.01); *G06F 1/3296* (2013.01); *G06F 1/08* (2013.01)

USPC ............................................. 327/156; 327/147

(58) Field of Classification Search
USPC .................................................. 327/147, 156
See application file for complete search history.

(56) References Cited

U.S. PATENT DOCUMENTS

| | | | |
|---|---|---|---|
| 7,282,966 B2* | 10/2007 | Narendra et al. | 327/99 |
| 7,724,078 B2* | 5/2010 | Kurd et al. | 327/544 |
| 8,222,933 B2* | 7/2012 | Nagaraj | 327/147 |
| 2007/0046343 A1* | 3/2007 | Kurd et al. | 327/156 |
| 2008/0122550 A1* | 5/2008 | Kurd et al. | 331/185 |
| 2009/0256601 A1* | 10/2009 | Zhang et al. | 327/156 |
| 2014/0085008 A1* | 3/2014 | Cohen et al. | 330/297 |
| 2014/0087672 A1* | 3/2014 | Mostov et al. | 455/78 |
| 2014/0087673 A1* | 3/2014 | Mostov et al. | 455/78 |
| 2014/0103973 A1* | 4/2014 | Kurd et al. | 327/156 |

* cited by examiner

*Primary Examiner* — Adam Houston
(74) *Attorney, Agent, or Firm* — Blakely, Sokoloff, Taylor & Zafman LLP

(57) ABSTRACT

Apparatuses, systems, and a method for providing a PLL architecture with scalable power are described. In one embodiment, a system includes one or more processing units having a voltage regulator to generate a controllably adjustable supply voltage for a phase-locked loop (PLL) circuit coupled to the voltage regulator. The PLL circuit compares a phase and frequency of the reference clock signal to a phase and frequency of a generated feedback clock signal and generates an output signal based on the comparison. A tracking unit adjusts the controllably adjustable supply voltage based on an operating frequency of the system.

22 Claims, 7 Drawing Sheets

SYSTEM AND METHOD FOR SCALING POWER OF A PHASE-LOCKED LOOP ARCHITECTURE

CROSS-REFERENCE TO RELATED APPLICATION

This patent application is a U.S. National Phase Application under 35 U.S.C. §371 of International Application No. PCT/US2011/066205, filed Dec. 20, 2011, entitled SYSTEM AND METHOD FOR SCALING POWER OF A PHASE-LOCKED LOOP ARCHITECTURE.

TECHNICAL FIELD

Embodiments of the invention relate to scaling power of a phase-locked loop architecture.

BACKGROUND

A phase-locked loop (PLL) is a control system that tries to generate an output signal with a phase that is related to the phase of the input reference signal. The PLL circuit includes a variable frequency oscillator and a phase detector. The PLL circuit compares the phase of the input signal with the phase of the signal derived from its output oscillator and adjusts the frequency of its oscillator to keep the phases matched. The signal from the phase detector is used to control the oscillator in a feedback loop. The supply voltage of the PLL circuit is regulated with fixed voltage and does not change with frequency. This architecture consumes more power than is necessary.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Apparatuses, systems, and a method for providing a PLL architecture with scalable power are described. In one embodiment, a processing system includes a PLL architecture that provides an adjustable supply voltage to a PLL circuit to enable power of the PLL circuit to be scaled with an operating frequency of the processing system. Thus, the PLL architecture consumes less power, which is desirable for various applications including low power and ultra low power applications.

In the following description, numerous specific details such as logic implementations, sizes and names of signals and buses, types and interrelationships of system components, and logic partitioning/integration choices are set forth in order to provide a more thorough understanding. It will be appreciated, however, by one skilled in the art that the invention may be practiced without such specific details. In other instances, control structures and gate level circuits have not been shown in detail to avoid obscuring the invention. Those of ordinary skill in the art, with the included descriptions, will be able to implement appropriate logic circuits without undue experimentation.

In the following description, certain terminology is used to describe features of the invention. For example, the term "logic" is representative of hardware and/or software configured to perform one or more functions. For instance, examples of "hardware" include, but are not limited or restricted to, an integrated circuit, a finite state machine or even combinatorial logic. The integrated circuit may take the form of a processor such as a microprocessor, application specific integrated circuit, a digital signal processor, a microcontroller, or the like. The interconnect between chips each could be point-to-point or each could be in a multi-drop arrangement, or some could be point-to-point while others are a multi-drop arrangement.

Figure 1:
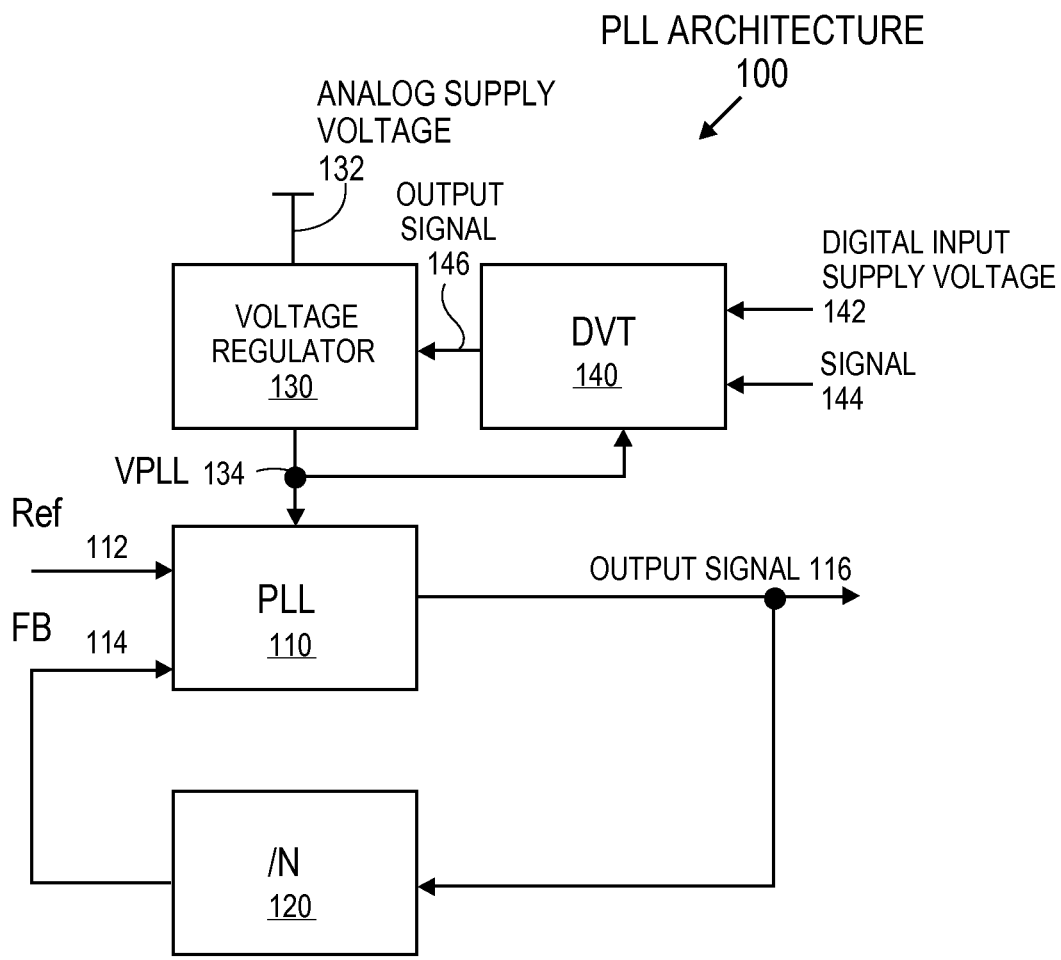
FIG. 1 illustrates a PLL architecture 100 (e.g., apparatus) in accordance with one embodiment.

FIG. 1 illustrates a PLL architecture 100 (e.g., apparatus) in accordance with one embodiment. This architecture enables scaling PLL power with frequency while maintaining a wide frequency range. The apparatus includes a voltage regulator 130 that receives an analog voltage 132 and generates an adjustable analog supply voltage 134. A phase-locked loop (PLL) circuit 110 is coupled to the voltage regulator 130. The PLL circuit 110 receives the analog supply voltage from the voltage regulator and also receives a reference clock signal 112 and feedback signal 114 as inputs. The PLL circuit 110 compares a phase and frequency of the reference clock signal 112 to a phase and frequency of a generated feedback clock signal 114 and generates an output signal 116 (e.g., output clock signal). A digital voltage tracking (DVT) unit 140 is coupled to the voltage regulator 130. The digital voltage tracking unit receives input signals 134, 142, and 144 and generates an output signal 146 to adjust the supply voltage (VPLL) 134 of the PLL circuit 110. The supply voltage 134 may be adjusted based on a digital input supply voltage signal 142 or a feedback ratio N of signal 144. The apparatus also includes a feedback divider 120 having the feedback ratio N. This feedback divider 120 receives the output signal 116 of the PLL and generates the feedback clock signal 114.

Figure 2:
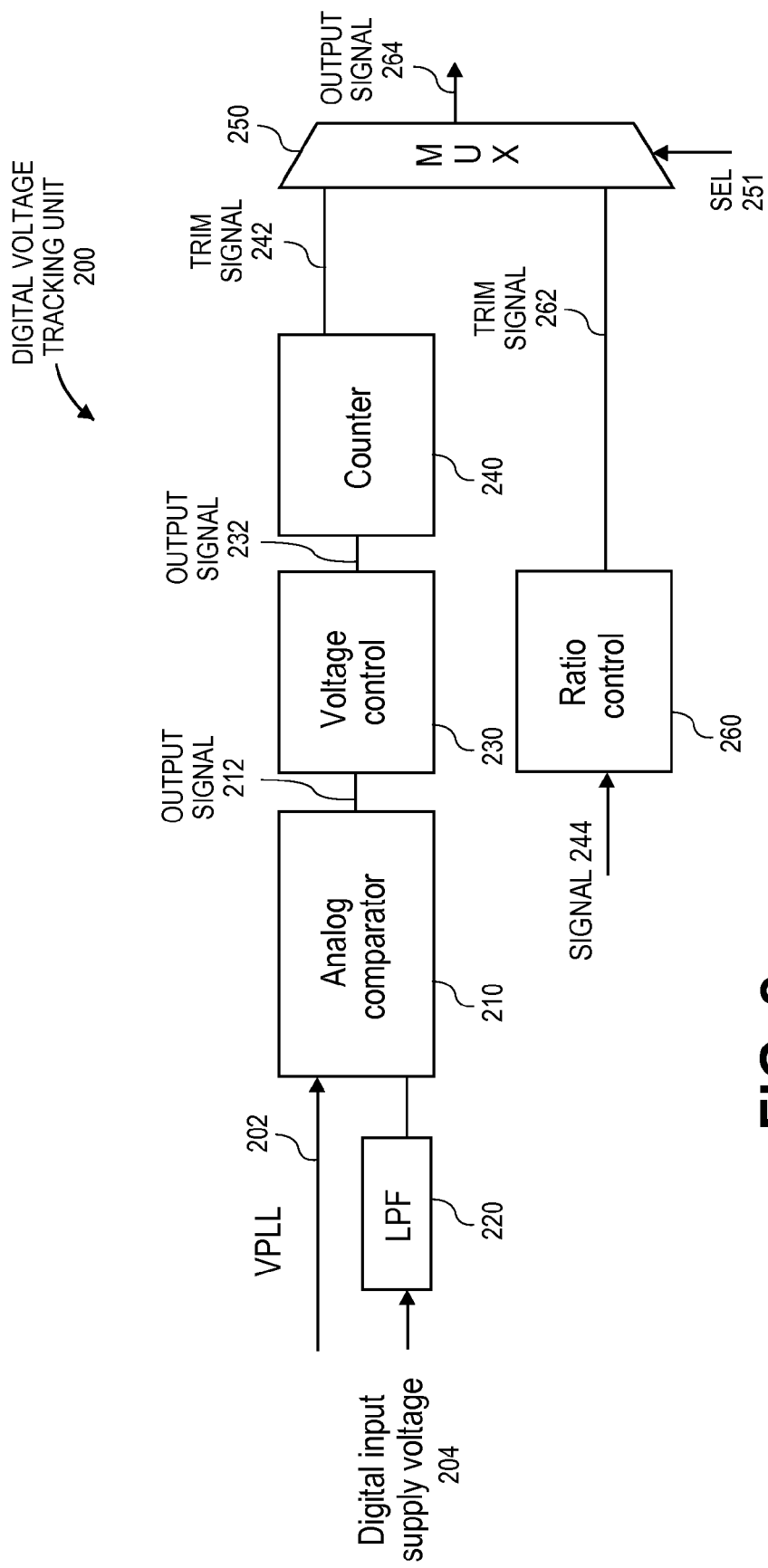
FIG. 2 illustrates a digital voltage tracking unit in accordance with one embodiment.

FIG. 2 illustrates a digital voltage tracking unit in accordance with one embodiment. The digital voltage tracking unit 200 includes similar components in comparison to digital voltage tracking unit 140. The digital voltage tracking unit 200 includes an analog comparator to compare the supply voltage (VPLL) signal 202 for the PLL circuit with the digital input supply voltage signal 204. A low pass filter 220 removes high frequency AC noise from the signal 204. A voltage control 230 receives an output signal 212 from the comparator 210 and determines whether the supply voltage signal 202 needs to be adjusted. The counter 240 generates a voltage based trim signal 242 to make any adjustments to the supply voltage signal 202 based on the output signal 232 of the voltage control unit 230. The voltage based trim signal 242 is based on the comparison of the supply voltage signal 202 for the PLL circuit with the digital input supply voltage 204. A multiplexer 250 receives the signal 242 and can send this signal to the voltage regulator 130 if this signal of the multiplexer is selected.

The digital input supply voltage may be the digital supply voltage for a computing system that includes one or more processing units and the PLL architecture 100 with the digital voltage tracking unit. The digital voltage tracking unit may provide the voltage based trim signal 242 to the voltage regulator to reduce the supply voltage in response to a reduced digital input supply voltage in order to reduce power consumption of the PLL circuit. A reduced digital input supply voltage indicates a reduced operating frequency of one or more processing units of the computing system that is associated with the PLL architecture and PLL circuit. The adjustable supply voltage provided to the PLL circuit enables power of the PLL circuit to be scaled with an operating frequency of the system. In this case, a lower operating frequency and digital supply voltage allows the adjustable supply voltage to be lowered as well to reduce power consumption of the PLL circuit. Alternatively, the digital voltage tracking unit may provide the voltage based trim signal to the voltage regulator to increase the supply voltage in response to an increased digital input supply voltage.

In another embodiment, the digital voltage tracking unit adjusts the supply voltage of the PLL circuit based on a ratio control 260 having a feedback ratio N of a feedback divider (e.g., feedback divider 120). The ratio control 260 receives a the feedback ratio N of signal 244 and generates a trim signal 262 for adjusting the supply voltage based on the feedback ratio. The multiplexer 250 receives the signal 262 and can send this signal to the voltage regulator 130 if this signal of the multiplexer is selected. The digital voltage tracking unit 200 may provide the trim signal 262 to the voltage regulator to reduce the supply voltage in response to a reduced feedback ratio in order to reduce power consumption of the PLL circuit. A reduced feedback ratio N indicates a reduced operating frequency. The adjustable supply voltage provided to the PLL circuit enables power of the PLL circuit to be scaled with operating frequency. In this case, a lower operating frequency and feedback ratio N allows the adjustable supply voltage to be lowered as well to reduce power consumption of the PLL circuit.

Alternatively, the digital voltage tracking unit may provide the trim signal to the voltage regulator to increase the supply voltage in response to an increased feedback ratio N.

In one embodiment, the multiplexer 250 selects a voltage based trim signal 242 or a ratio based trim signal 262. In some embodiments, the multiplexer select 251 may be coupled to a fuse to set the selection, e.g., during a manufacturing phase based on an anticipated user model for a computing system. For example, a selection of the voltage based trim signal 242 during the manufacturing phase may be appropriate for a user model in which a change in frequency automatically results in a change in voltage. A selection of the ratio based trim signal 262 during the manufacturing phase may be appropriate for a user model in which a change in frequency does not result in a change in voltage. The ratio based trim signal 262 can be determined using a lookup table having different feedback ratio N values regardless of the user model. In this case, a reduction in frequency results in a reduction in supply voltage and thus reduced power even if the user model does not reduce supply voltage with frequency.

The adjustable supply voltage provided to the PLL circuit enables power of the PLL circuit to be scaled with frequency of the PLL circuit across a frequency range. The PLL circuit does not need a post PLL divider for tuning the PLL circuit within a frequency range. The PLL circuit supports a wide frequency range by stretching its tuning range to cover the entire target frequency range. This occurs by making the PLL voltage scalable based on a digital supply voltage or a digital feedback ratio. For example, to support a 0.5-4 GHz frequency range the supply voltage of the PLL voltage increases or decreases such that a post PLL divider (e.g., P divider) is not needed causing the power of the PLL circuit to scale with frequency. In an embodiment, a processor clock frequency and digital voltage supply decrease. This causes a decrease in the feedback ratio N (e.g., from 5 to 40 for 100 MHz reference clock and 0.5-4 GHz frequency range). In this case, the supply voltage to the PLL is also decreased (e.g., from 1.1 to 0.75 volts) in order to scale the voltage with frequency and reduce power consumption of the PLL circuit.

Returning to FIG. 1, the frequency of the output signal of the PLL circuit is a function of the controllably adjustable analog supply voltage 134 supplied to the PLL circuit 110. The PLL circuit may include a ring oscillator based PLL circuit, a self-biased analog circuit, a digital circuit, or an analog/digital circuit. The PLL circuit 110 generates the output clock signal 116 that tracks an applied reference clock 112 for a load. The PLL circuit 110 may include a phase frequency detector, a charge pump, and a voltage controlled oscillator. The voltage controlled oscillator (VCO) generates the output signal 116. The phase frequency detector compares the phase/frequency of the feedback signal 114 with the phase/frequency of the reference signal 112 and increases or decreases charge on the charge pump, based on which signal is ahead of the other, to increase or decrease the VCO clock phase/frequency. If the output clock is ahead of the reference clock, the phase frequency detector controls the charge pump to reduce the phase/frequency of the VCO clock; conversely, if it is behind the reference clock, the VCO is controlled to increase the VCO clock phase/frequency.

Figure 3:
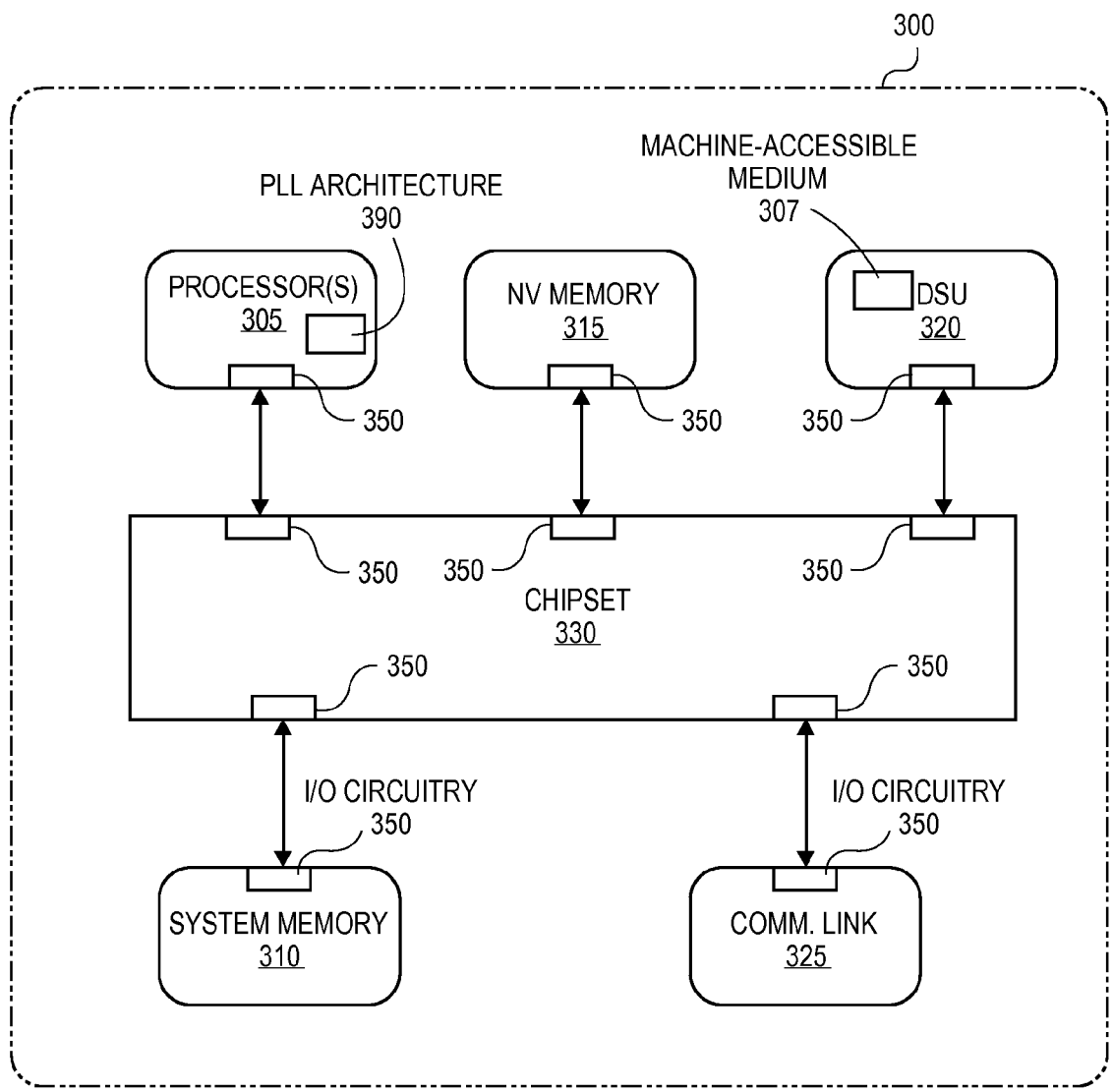
FIG. 3 illustrates a functional block diagram illustrating a system 300 implemented in accordance with one embodiment.

FIG. 3 illustrates a functional block diagram illustrating a system 300 implemented in accordance with one embodiment. The illustrated embodiment of processing system 300 includes one or more processors (or central processing units) 305 having PLL architecture 390, system memory 310, non-volatile ("NV") memory 315, a data storage unit ("DSU") 320, a communication link 325, and a chipset 330. The illustrated processing system 300 may represent any computing system including a desktop computer, a notebook computer, a workstation, a handheld computer, a server, a blade server, or the like.

The elements of processing system 300 are interconnected as follows. Processor(s) 305 is communicatively coupled to system memory 310, NV memory 315, DSU 320, and communication link 325, via chipset 330 to send and to receive instructions or data thereto/therefrom. In one embodiment, NV memory 315 is a flash memory device. In other embodiments, NV memory 315 includes any one of read only memory ("ROM"), programmable ROM, erasable programmable ROM, electrically erasable programmable ROM, or the like. In one embodiment, system memory 310 includes random access memory ("RAM"), such as dynamic RAM ("DRAM"), synchronous DRAM, ("SDRAM"), double data rate SDRAM ("DDR SDRAM"), static RAM ("SRAM"), and the like. DSU 320 represents any storage device for software data, applications, and/or operating systems, but will most typically be a nonvolatile storage device. DSU 320 may optionally include one or more of an integrated drive electronic ("IDE") hard disk, an enhanced IDE ("EIDE") hard disk, a redundant array of independent disks ("RAID"), a small computer system interface ("SCSI") hard disk, and the like. Although DSU 320 is illustrated as internal to processing system 300, DSU 320 may be externally coupled to processing system 300. Communication link 325 may couple processing system 300 to a network such that processing system 300 may communicate over the network with one or more other computers. Communication link 325 may include a modem, an Ethernet card, a Gigabit Ethernet card, Universal Serial Bus ("USB") port, a wireless network interface card, a fiber optic interface, or the like.

The DSU 320 may include a machine-accessible medium 307 on which is stored one or more sets of instructions (e.g., software) embodying any one or more of the methods or functions described herein. The software may also reside, completely or at least partially, within the processor(s) 305 during execution thereof by the processor(s) 305, the processor(s) 305 also constituting machine-accessible storage media.

While the machine-accessible medium 307 is shown in an exemplary embodiment to be a single medium, the term "machine-accessible medium" should be taken to include a single medium or multiple media (e.g., a centralized or distributed database, and/or associated caches and servers) that store the one or more sets of instructions. The term "machine-accessible medium" shall also be taken to include any medium that is capable of storing, encoding or carrying a set of instructions for execution by the machine and that cause the machine to perform any one or more of the methodologies of the present invention. The term "machine-accessible medium" shall accordingly be taken to include, but not be limited to, solid-state memories, optical, and magnetic media.

Thus, a machine-accessible medium includes any mechanism that provides (i.e., stores and/or transmits) information in a form accessible by a machine (e.g., a computer, network device, personal digital assistant, manufacturing tool, any device with a set of one or more processors, etc.). For example, a machine-accessible medium includes recordable/non-recordable media (e.g., read only memory (ROM); random access memory (RAM); magnetic disk storage media; optical storage media; flash memory devices; etc.), as well as electrical, optical, acoustical or other forms of propagated signals (e.g., carrier waves, infrared signals, digital signals, etc.); etc.

As illustrated in FIG. 3, each of the subcomponents of processing system 300 includes input/output ("I/O") circuitry 350 for communication with each other. I/O circuitry 350 may include impedance matching circuitry that may be adjusted to achieve a desired input impedance thereby reducing signal reflections and interference between the subcomponents. In one embodiment, the PLL architecture 390 (e.g., PLL architecture 100) may be included within various digital systems. For example, the PLL architecture 390 may be included within the processor(s) 305 and/or communicatively coupled to the processor(s) to provide a flexible clock source. The clock source may be provided to state elements for the processors(s) 305.

It should be appreciated that various other elements of processing system 300 have been excluded from FIG. 3 and this discussion for the purposes of clarity. For example, processing system 300 may further include a graphics card, additional DSUs, other persistent data storage devices, and the like. Chipset 330 may also include a system bus and various other data buses for interconnecting subcomponents, such as a memory controller hub and an input/output ("I/O") controller hub, as well as, include data buses (e.g., peripheral component interconnect bus) for connecting peripheral devices to chipset 330. Correspondingly, processing system 300 may operate without one or more of the elements illustrated. For example, processing system 300 need not include DSU 320.

Figure 4:
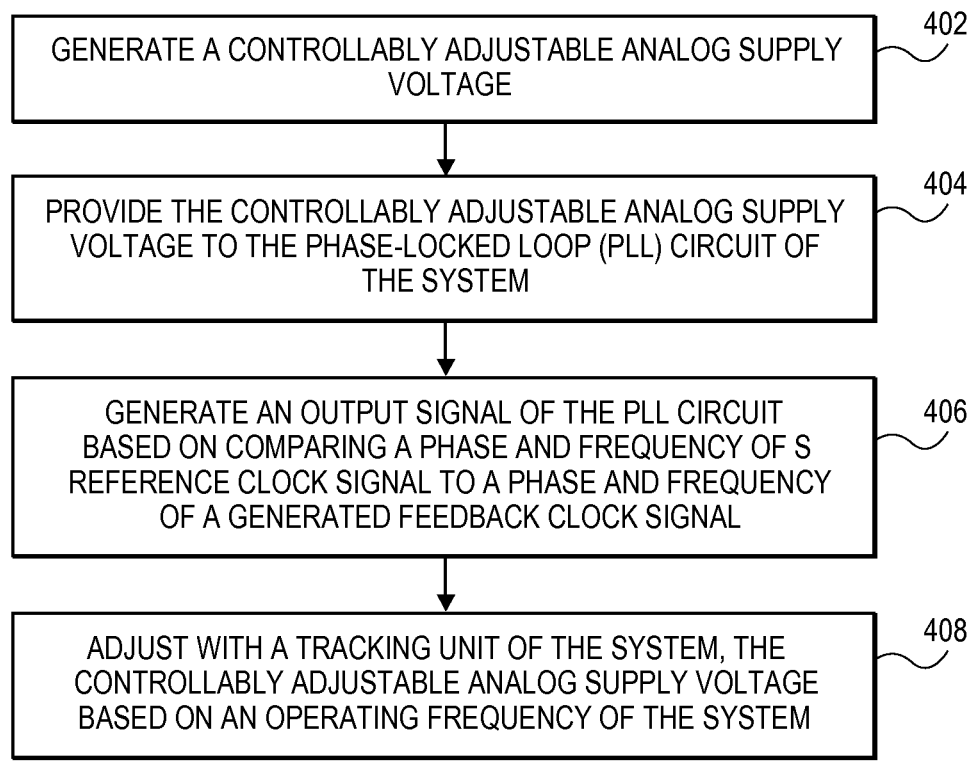
FIG. 4 illustrates a flow diagram of one embodiment for a computer-implemented method 400 of scaling a supply voltage of a phase-locked loop (PLL) circuit of a system in accordance with one embodiment.

FIG. 4 illustrates a flow diagram of one embodiment for a computer-implemented method 400 of scaling a supply voltage of a phase-locked loop (PLL) circuit of a system in accordance with one embodiment. The method 400 is performed by processing logic that may comprise hardware (circuitry, dedicated logic, etc.), software (such as is run on a general purpose computer system or a dedicated machine or a device), or a combination of both. In one embodiment, the method 400 is performed by processing logic associated with the PLL architecture and PLL circuit discussed herein.

At block 402, the processing logic generates a controllably adjustable analog supply voltage. At block 404, the processing logic provides the controllably adjustable analog supply voltage to the phase-locked loop (PLL) circuit of the system. At block 406, the processing logic generates an output signal of the PLL circuit based on comparing a phase and frequency of a reference clock signal to a phase and frequency of a generated feedback clock signal. A feedback divider of the PLL circuit may generate the feedback clock signal. At block 408, the processing logic adjusts, with a tracking unit of the system, the controllably adjustable analog supply voltage based on an operating frequency of the system. The tracking unit reduces the controllably adjustable analog supply voltage in response to a reduced operating frequency in order to reduce power consumption of the PLL circuit. In one embodiment, the tracking unit reduces the controllably adjustable analog supply voltage in response to a reduced feedback ratio of the feedback divider. In another embodiment, the tracking unit reduces the controllably adjustable analog supply voltage in response to a reduced digital supply voltage of the system.

Figure 5:
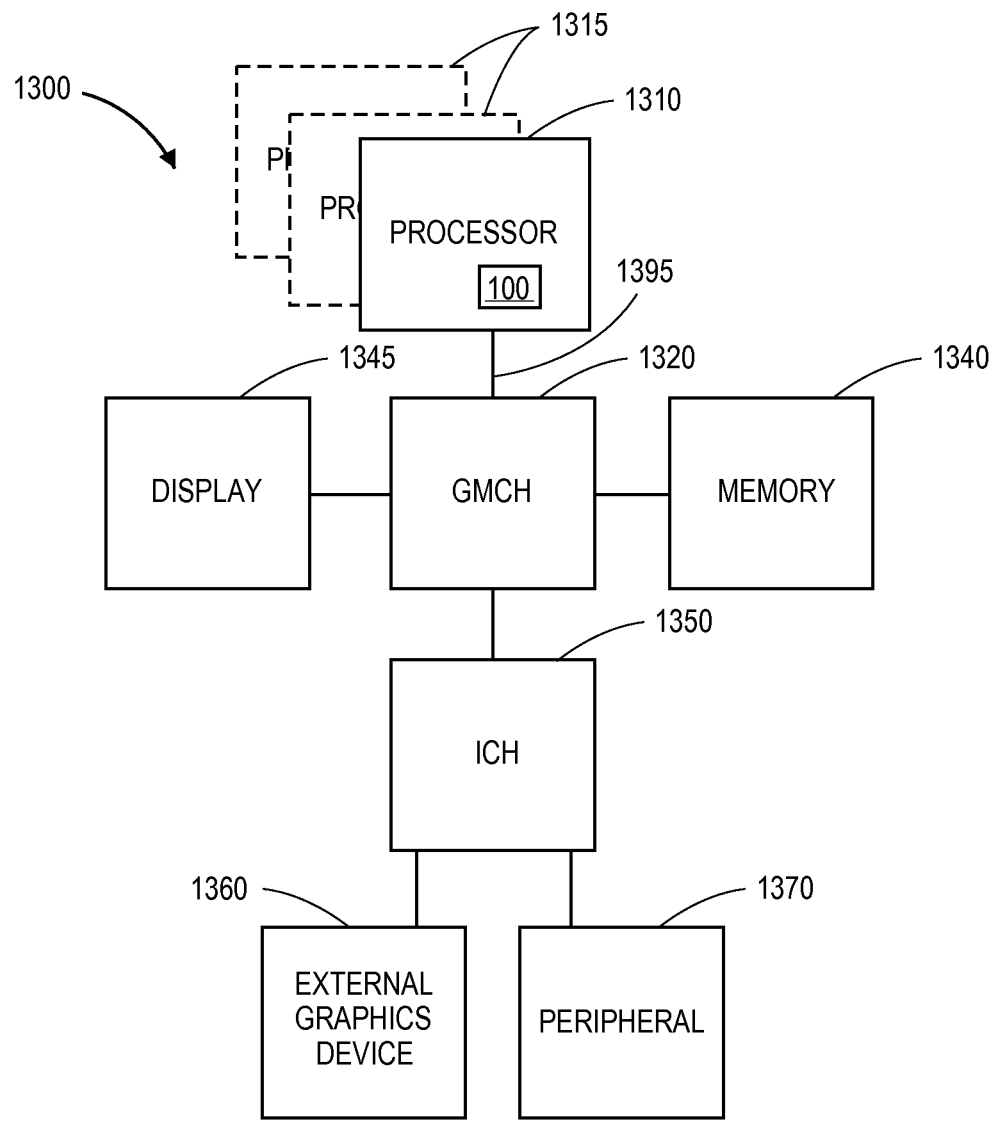
FIG. 5 is a block diagram of a system 1300 in accordance with one embodiment of the invention.

FIG. 5 illustrates a block diagram of a system 1300 in accordance with one embodiment. The system 1300 may include one or more processors 1310, 1315, which are coupled to graphics memory controller hub (GMCH) 1320. The optional nature of additional processors 1315 is denoted in FIG. 3 with broken lines. The one or more processors 1310, 1315 include in part a PLL architecture 100 as discussed above. The system 1300 further includes memory 1340 coupled to the one or more processing units.

Figure 6:
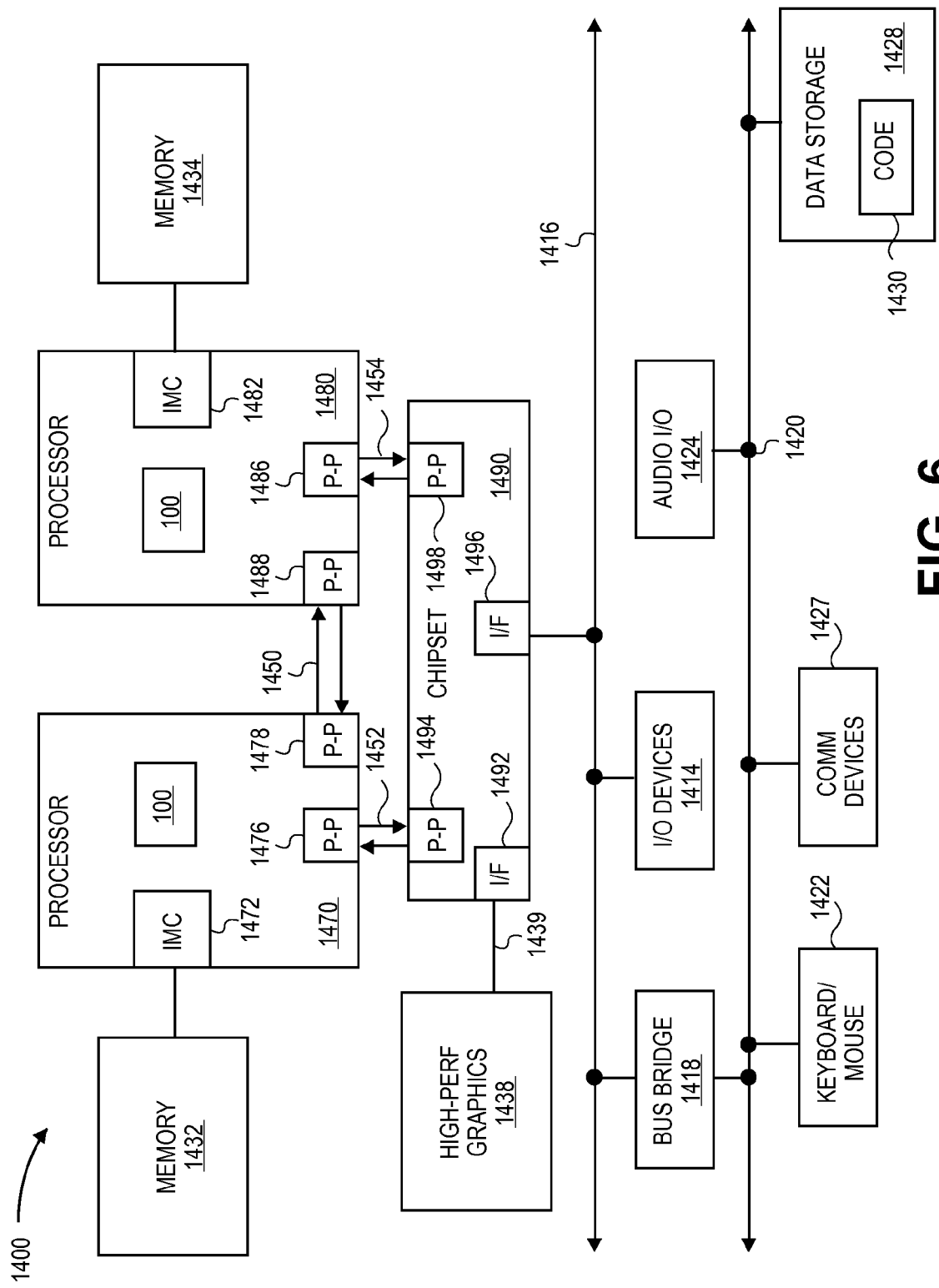
FIG. 6 is a block diagram of a second system 1400 in accordance with an embodiment of the invention.

FIG. 6 illustrates that the GMCH 1320 may be coupled to the memory 1340 that may be, for example, a dynamic random access memory (DRAM). The DRAM may, for at least one embodiment, be associated with a non-volatile cache.

The GMCH 1320 may be a chipset, or a portion of a chipset. The GMCH 1320 may communicate with the processor(s) 1310, 1315 and control interaction between the processor(s) 1310, 1315 and memory 1340. The GMCH 1320 may also act as an accelerated bus interface between the processor(s) 1310, 1315 and other elements of the system 1300. For at least one embodiment, the GMCH 1320 communicates with the processor(s) 1310, 1315 via a multi-drop bus, such as a frontside bus (FSB) 1395.

Furthermore, GMCH 1320 is coupled to a display 1345 (such as a flat panel display). GMCH 1320 may include an integrated graphics accelerator. GMCH 1320 is further coupled to an input/output (I/O) controller hub (ICH) 1350, which may be used to couple various peripheral devices to system 1300. Shown for example in the embodiment of FIG. 5 is an external graphics device 1360, which may be a discrete graphics device coupled to ICH 1350, along with another peripheral device 1370.

Alternatively, additional or different processors may also be present in the system 1300. For example, additional processor(s) 1315 may include additional processors(s) that are the same as processor 1310, additional processor(s) that are heterogeneous or asymmetric to processor 1310, accelerators (such as, e.g., graphics accelerators or digital signal processing (DSP) units), field programmable gate arrays, or any other processor. There can be a variety of differences between the physical resources 1310, 1315 in terms of a spectrum of metrics of merit including architectural, microarchitectural, thermal, power consumption characteristics, and the like. These differences may effectively manifest themselves as asymmetry and heterogeneity amongst the processing elements 1310, 1315. For at least one embodiment, the various processing elements 1310, 1315 may reside in the same die package.

Referring now to FIG. 6, shown is a block diagram of a second system 1400 in accordance with an embodiment of the present invention. As shown in FIG. 6, multiprocessor system 1400 is a point-to-point interconnect system, and includes a first processor 1470 and a second processor 1480 coupled via a point-to-point interconnect 1450. As shown in FIG. 6, each of processors 1470 and 1480 includes the PLL architecture 100 described herein. Alternatively, one or more of processors 1470, 1480 may be an element other than a processor, such as an accelerator or a field programmable gate array. While shown with only two processors 1470, 1480, it is to be understood that the scope of the present invention is not so limited. In other embodiments, one or more additional processing elements may be present in a given processor.

Processor 1470 may further include an integrated memory controller hub (IMC) 1472 and point-to-point (P-P) interfaces 1476 and 1478. Similarly, second processor 1480 may include a IMC 1482 and P-P interfaces 1486 and 1488. Processors 1470, 1480 may exchange data via a point-to-point (PtP) interface 1450 using PtP interface circuits 1478, 1488. As shown in FIG. 5, IMC's 1472 and 1482 couple the processors to respective memories, namely a memory 1442 and a memory 1444, which may be portions of main memory locally attached to the respective processors.

Processors 1470, 1480 may each exchange data with a chipset 1490 via individual P-P interfaces 1452, 1454 using point to point interface circuits 1476, 1494, 1486, 1498. Chipset 1490 may also exchange data with a high-performance graphics circuit 1438 via a high-performance graphics interface 1439.

A shared cache (not shown) may be included in either processor outside of both processors, yet connected with the processors via P-P interconnect, such that either or both processors' local cache information may be stored in the shared cache if a processor is placed into a low power mode.

Chipset 1490 may be coupled to a first bus 1416 via an interface 1496. In one embodiment, first bus 1416 may be a Peripheral Component Interconnect (PCI) bus, or a bus such as a PCI Express bus or another third generation I/O interconnect bus, although the scope of the present invention is not so limited.

As shown in FIG. 6, various I/O devices 1414 may be coupled to first bus 1416, along with a bus bridge 1418 which couples first bus 1416 to a second bus 1420. In one embodiment, second bus 1420 may be a low pin count (LPC) bus. Various devices may be coupled to second bus 1420 including, for example, a keyboard/mouse 1422, communication devices 1426 and a data storage unit 1428 such as a disk drive or other mass storage device which may include code 1430, in one embodiment. Further, an audio I/O 1424 may be coupled to second bus 1420. Note that other architectures are possible. For example, instead of the point-to-point architecture of FIG. 6, a system may implement a multi-drop bus or other such architecture.

Figure 7:
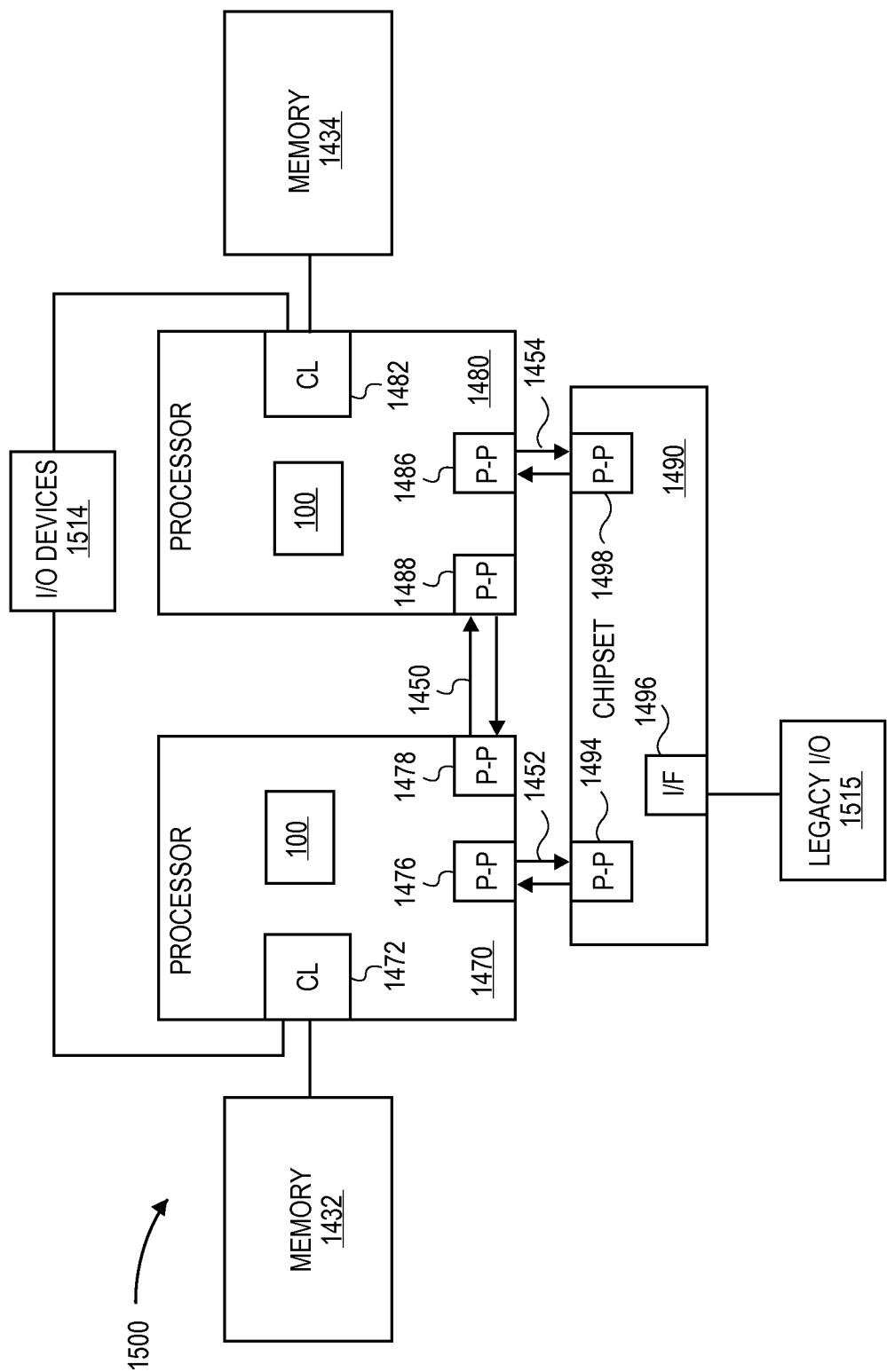
FIG. 7 is a block diagram of a third system 1500 in accordance with an embodiment of the invention.

Referring now to FIG. 7, shown is a block diagram of a third system 1500 in accordance with an embodiment of the present invention. Like elements in FIGS. 6 and 7 bear like reference numerals, and certain aspects of FIG. 7 have been omitted from FIG. 7 in order to avoid obscuring other aspects of FIG. 7.

FIG. 7 illustrates that the processing elements 1470, 1480 may include the PLL architecture (e.g., 100), integrated memory and I/O control logic ("CL") 1472 and 1482, respectively. For at least one embodiment, the CL 1472, 1482 may include memory controller hub logic (IMC) such as that described above in connection with FIGS. 4 and 5. In addition, CL 1472, 1482 may also include I/O control logic. FIG. 7 illustrates that not only are the memories 1442, 1444 coupled to the CL 1472, 1482, but also that I/O devices 1514 are also coupled to the control logic 1472, 1482. Legacy I/O devices 1515 are coupled to the chipset 1490.

Embodiments of the invention provide an adjustable supply voltage to the PLL circuit to enable power of the PLL circuit to be scaled with frequency of the PLL circuit across a frequency range. The PLL circuit does not need a post PLL divider for tuning the PLL circuit within a frequency range. The PLL circuit supports a wide frequency range by stretching its tuning range to cover the entire target frequency range. This occurs by making the PLL voltage scalable based on a digital supply voltage or a digital feedback ratio. The PLL architecture operates robustly over a wide frequency range and provides maximum flexibility for various applications. Existing PLLs are not able to scale power of the PLL with frequency. A traditional phase-locked loop (PLL) system includes a low dropout voltage regulator, a PLL circuit, a post PLL divider with a ratio of P, and a feedback divider with a ratio of N. The post PLL divider follows the PLL circuit in series prior to injecting clock into the clock distribution network or a PLL output signal. The post PLL divider in combination with the feedback divider and the reference clock frequency determines the PLL VCO frequency.

The low dropout regulator provides a fixed voltage that does not change with frequency to the PLL circuit. The PLL circuit receives an input reference signal from a reference source and an input feedback signal from the feedback divider N. The PLL circuit's output frequency equals the product of the frequency of the reference signal, N, and P. N is the desired ratio of the feedback divider and P is the desired ratio of post PLL divider, which is set to maintain the PLL circuit within its tuning range (target frequency range). The supply voltage of the PLL circuit is regulated with fixed voltage and does not change with frequency.

To support a wide frequency range, the oscillator of the PLL circuit is tuned in a certain range (e.g., 2-4 GHz). Post PLL dividers (P divider) are injected to achieve a target frequency range (e.g., 2-4 GHz, 1-2 GHz, 0.5-1 GHz). For example, to support a target frequency range of 1-2 GHz a divide by 2 divider is used and for 0.5-1 GHz a divide by 4 divider is used to ensure the PLL remains in its 2-4 GHz tuning range. This architecture consumes more power than is necessary, especially for lower operating frequencies. The drawback with this architecture at lower operating frequency is that the PLL power is not scaling but remains constant. The lack of scaling causes a higher percentage of total PLL power in the low voltage, low frequency operating conditions. This power is multiplied by the total number of PLLs.

With the increase in integration of various designs, the number of PLLs in microprocessors range from 10-20 PLLs depending on the configuration and thus the power of the PLL is increased accordingly. Reducing power of the PLLs and making it scalable with frequency is important to reduce overall power consumption in particular in the ultra low power segments. For example, reducing power of the 10-20

PLLs for an ultra low power segment translates to a 150-300 milliwatt power reduction (e.g., 1.5-3% for a 10 watt processor).

It should be appreciated that reference throughout this specification to "one embodiment" or "an embodiment" means that a particular feature, structure or characteristic described in connection with the embodiment is included in at least one embodiment. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments.

In the above detailed description of various embodiments, reference is made to the accompanying drawings, which form a part hereof, and in which are shown by way of illustration, and not of limitation, specific embodiments in which the invention may be practiced. In the drawings, like numerals describe substantially similar components throughout the several views. The embodiments illustrated are described in sufficient detail to enable those skilled in to the art to practice the teachings disclosed herein. Other embodiments may be utilized and derived there from, such that structural and logical substitutions and changes may be made without departing from the scope of this disclosure. The following detailed description, therefore, is not to be taken in a limiting sense, and the scope of various embodiments is defined only by the appended claims, along with the full range of equivalents to which such claims are entitled.

What is claimed is:

1. A system, comprising:
one or more processing units, comprising,
a voltage regulator to generate a controllably adjustable supply voltage;
a phase-locked loop (PLL) circuit coupled to the voltage regulator, the PLL circuit to receive the controllably adjustable supply voltage from the voltage regulator, to compare a phase and frequency of a reference clock signal to a phase and frequency of a generated feedback clock signal, and to generate an output signal based on the comparison; and
a tracking unit to adjust the controllably adjustable supply voltage based on an operating frequency of the system.

2. The system of claim 1, wherein the tracking unit to reduce the controllably adjustable supply voltage in response to a reduced operating frequency to reduce power consumption of the PLL circuit.

3. The system of claim 1, wherein the tracking unit to adjust the supply voltage provided to the PLL circuit based on a ratio control.

4. The system of claim 3, further comprising:
a feedback divider having a feedback ratio to receive the output signal and to generate the feedback clock signal based on the feedback ratio, wherein the ratio control to receive the feedback ratio and to generate a trim signal for adjusting the supply voltage based on the feedback ratio.

5. The system of claim 1, wherein the adjustable supply voltage provided to the PLL circuit enables power of the PLL circuit to be scaled with a digital supply voltage of the system.

6. The system of claim 1, wherein the PLL circuit does not need a post PLL divider for tuning the PLL circuit within a frequency range.

7. The system of claim 1, further comprising:
memory coupled to the one or more processing units; and
a communication link to couple the system to a wireless network, wherein the one or more processing units to receive a clock signal that is based on the output signal of the PLL circuit.

8. An apparatus, comprising:
a voltage regulator to generate a supply voltage;
a phase-locked loop (PLL) circuit coupled to the voltage regulator, the PLL circuit to receive the supply voltage from the voltage regulator and to receive a reference clock signal as input and to generate an output signal; and
a digital voltage tracking unit coupled to the voltage regulator, the digital voltage tracking unit to adjust the supply voltage of the PLL circuit based on a digital input supply voltage.

9. The apparatus of claim 8, wherein the digital voltage tracking unit further comprises an analog comparator to compare the supply voltage for the PLL circuit with the digital input supply voltage.

10. The apparatus of claim 9, wherein the digital voltage tracking unit further comprises:
a voltage control unit, coupled to the analog comparator; and
a counter, coupled to the voltage control unit, to generate a voltage based trim signal based on the comparison of the supply voltage for the PLL circuit with the digital input supply voltage.

11. The apparatus of claim 10, wherein the digital voltage tracking unit to provide the voltage based trim signal to the voltage regulator to reduce the supply voltage in response to a reduced digital input supply voltage in order to reduce power consumption of the PLL circuit.

12. The apparatus of claim 10, wherein the digital voltage tracking unit to provide the voltage based trim signal to the voltage regulator to increase the supply voltage in response to an increased digital input supply.

13. The apparatus of claim 8, further comprising:
a feedback divider having a ratio of N to receive the output signal and to generate the feedback clock signal.

14. The apparatus of claim 8, wherein the adjustable supply voltage provided to the PLL circuit enables power of the PLL circuit to be scaled with a frequency of a processing system.

15. A computer-implemented method, comprising:
providing a controllably adjustable analog supply voltage to a phase-locked loop (PLL) circuit of a system;
generating an output signal of the PLL circuit based on comparing a phase and frequency of a reference clock signal to a phase and frequency of a generated feedback clock signal; and
adjusting, with a tracking unit of the system, the controllably adjustable analog supply voltage based on an operating frequency of the system.

16. The computer-implemented method of claim 15, wherein the tracking unit to reduce the controllably adjustable analog supply voltage in response to a reduced operating frequency in order to reduce power consumption of the PLL circuit.

17. The computer-implemented method of claim 15, wherein the tracking unit to reduce the controllably adjustable analog supply voltage in response to a reduced feedback ratio of the feedback divider.

18. A processor, comprising:
a voltage regulator to generate a controllably adjustable supply voltage;
a phase-locked loop (PLL) circuit coupled to the voltage regulator, the PLL circuit to receive the controllably adjustable supply voltage from the voltage regulator, to compare a phase and frequency of a reference clock signal to a phase and frequency of a generated feedback clock signal, and to generate an output signal based on the comparison; and a tracking unit to adjust the controllably adjustable supply voltage based on an operating frequency of the system.

19. The processor of claim 18, wherein the tracking unit to reduce the controllably adjustable supply voltage in response to a reduced operating frequency to reduce power consumption of the PLL circuit.

20. The processor of claim 18, wherein the tracking unit to adjust the supply voltage provided to the PLL circuit based on a ratio control.

21. The processor of claim 20, further comprising:

a feedback divider having a feedback ratio to receive the output signal and to generate the feedback clock signal based on the feedback ratio, wherein the ratio control to receive the feedback ratio and to generate a trim signal for adjusting the supply voltage based on the feedback ratio.

22. The processor of claim 18, wherein the adjustable supply voltage provided to the PLL circuit enables power of the PLL circuit to be scaled with a digital supply voltage of the system.

* * * * *